United States Patent
Kang

(10) Patent No.: US 7,978,536 B2
(45) Date of Patent: Jul. 12, 2011

(54) SEMICONDUCTOR MEMORY DEVICE AND METHOD OF OPERATING THE SAME

(75) Inventor: Khil-Ohk Kang, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 401 days.

(21) Appl. No.: 12/217,045

(22) Filed: Jun. 30, 2008

(65) Prior Publication Data

US 2009/0168553 A1    Jul. 2, 2009

(30) Foreign Application Priority Data

Dec. 27, 2007 (KR) .................. 10-2007-0138584

(51) Int. Cl.
*G11C 5/14* (2006.01)
(52) U.S. Cl. ...................... 365/189.09; 365/226
(58) Field of Classification Search .................. 365/226, 365/194, 189.09, 189.11, 189.07, 227; 327/536
See application file for complete search history.

(56) References Cited

U.S. PATENT DOCUMENTS

| | | | | |
|---|---|---|---|---|
| 5,337,284 | A * | 8/1994 | Cordoba et al. | 365/227 |
| 6,275,096 | B1 * | 8/2001 | Hsu et al. | 327/535 |
| 6,370,075 | B1 * | 4/2002 | Haeberli et al. | 365/226 |
| 6,385,115 | B1 * | 5/2002 | Nakai | 365/226 |
| 6,459,643 | B2 * | 10/2002 | Kondo et al. | 365/226 |
| 7,154,802 | B2 * | 12/2006 | Kono et al. | 365/226 |

FOREIGN PATENT DOCUMENTS

| KR | 1020030097024 | 12/2003 |
|---|---|---|
| KR | 1020040008333 | 1/2004 |

\* cited by examiner

*Primary Examiner* — VanThu Nguyen
*Assistant Examiner* — Douglas King
(74) *Attorney, Agent, or Firm* — Blakely, Sokoloff, Taylor & Zafman

(57) ABSTRACT

Semiconductor memory device and method of operating the same includes an enable signal generator configured to generate first and second enable signals having activation timings determined in response to activation of an active command, the first enable signal being deactivated after a first time from a deactivation timing of the active command, and the second enable signal being deactivated after a second time longer than the first time from the deactivation timing of the active command. Internal voltage generators are configured to generate internal voltages. At least one of the internal voltage generators is turned on/off in response to the first enable signal, and at least one other of the internal voltage generators is turned on/off in response to the second enable signals.

16 Claims, 6 Drawing Sheets

SEMICONDUCTOR MEMORY DEVICE AND METHOD OF OPERATING THE SAME

CROSS-REFERENCE TO RELATED APPLICATIONS

The present invention claims priority of Korean patent application number 10-2007-0138584, filed on Dec. 27, 2007, which is incorporated by reference in its entirety.

BACKGROUND OF THE INVENTION

The present invention relates to a semiconductor memory device, especially a circuit of generating internal voltages used for internal operations of a semiconductor memory device, and more particularly, to a semiconductor memory device that operates with low power by reducing a current consumed in generating an internal voltage.

Most of semiconductor devices such as DRAMs include an internal voltage generating circuit configured to generate a plurality of internal voltages having various voltage levels by the use of a power supply voltage (VDD) and a ground voltage (VSS) supplied from the outside. Therefore, a semiconductor device supplies a plurality of internal voltages required for operation of a circuitry inside a chip by itself through the internal voltage generating circuit.

In general, a process of generating the plurality of internal voltages includes a process of generating a reference voltage having a reference voltage level, and a process of generating an internal voltage through a charge-pumping or down-converting method using the generated reference voltage.

Examples of the internal voltage generated through the charge-pumping method are a boosted voltage (VPP) and a back bias voltage (VBB). Examples of the internal voltage generated through the down-converting operation are a core voltage (VCORE), and the like.

The boosted voltage (VPP), which has a higher voltage level than an external power supply voltage (VDD), is supplied to a word line connected to a gate of a cell transistor when a cell is accessed, thereby preventing the loss of cell data caused by a threshold voltage (Vth) of the cell transistor.

The back bias voltage (VBB), which has a lower voltage level than a ground voltage (VSS), reduces a variation in the threshold voltage (Vth) of the cell transistor due to the body effect on the cell transistor. Resultingly, the back bias voltage (VBB) increases the reliability of operation of the cell transistor, and reduces a channel leakage current generated in the cell transistor.

The core voltage (VCORE), which has a lower voltage level than the external power supply voltage (VDD) and a higher voltage level than the ground voltage (VSS), reduces a power required for maintaining a voltage level of data stored in a cell and also allows the cell transistor to be stably operated.

The internal voltage generator of generating the internal voltages, i.e., VPP, VBB and VCORE, is designed such that it operates to have a predetermined variance within an operating voltage region and an operating temperature range of a semiconductor memory device.

FIG. 1 is a block diagram of an internal voltage generating circuit in a conventional semiconductor memory device.

Referring to FIG. 1, the internal voltage generating circuit in the conventional semiconductor memory device includes an enable signal generator 100, a reference voltage generator 140, and a plurality of internal voltage generators 120A, 120B, 120C, 120D and 120E. The enable signal generator 100 generates an enable signal CTRL of which an activation timing is determined in response to activation of an active command ACT corresponding to operation of the semiconductor memory device. The enable signal CTRL is deactivated after a predetermined time from a deactivation timing of the active command ACT. The reference voltage generator 140 generates a reference voltage VREF having a constant level regardless of process, voltage and temperature (PVT) variations. The plurality of internal voltage generators, i.e., zeroth to fourth internal voltage generators 120A, 120B, 120C, 120D and 120E generate internal voltages VINT based on a predetermined target level corresponding to the reference voltage VREF, and are turned on/off in response to the enable signal CTRL.

The first internal voltage generator 120A includes a zeroth internal voltage detecting unit 122A, and a zeroth voltage driving unit 124A. The zeroth internal voltage detecting unit 122A detects an internal voltage terminal (hereinafter, referred to as VINT terminal) based on the predetermined target level corresponding to the reference voltage VREF, and is turned on/off in response to the enable signal CTRL. The zeroth voltage driving unit 124A drives the VINT terminal to a voltage level corresponding to the predetermined target level in response to an output signal VINT_DET0 of the zeroth internal voltage detector 122A. Likewise, the first internal generator 120B includes a first internal voltage detecting unit 122B and a first voltage driving unit 124B, the second internal generator 120C includes a second internal voltage detecting unit 122C and a second voltage driving unit 124C, the third internal generator 120D includes a third internal voltage detecting unit 122D and a third voltage driving unit 124D, and the fourth internal generator 120E includes a fourth internal voltage detecting unit 122E and a fourth voltage driving unit 124E. The first to fourth internal voltage detecting units 122B, 122C, 122D and 122E operate in the same manner as the zeroth internal voltage detecting unit 122A, and thus further description for them will be omitted herein. Similarly, first to fourth voltage driving units 124B, 124C, 124D and 124E operate in the same manner as the zeroth voltage driving unit 124A, and thus further description for them will also be omitted herein.

The internal voltages VINT generated through the plurality of internal voltage generators 120A, 120B, 120C, 120D and 120E are input to an internal circuit 160 of the semiconductor memory device and then used to perform predetermined internal operations.

FIG. 2 is a circuit diagram of the enable signal generator 100 of the internal voltage generating circuit in the conventional semiconductor memory device in FIG. 1.

Referring to FIG. 2, the enable signal generator 100 includes a first inverter INT1 configured to receive an active command ACT to output an output signal D1, a delay element configured to delay the active command ACT by a predetermined delay time, a second inverter INT2 configured to receive an output signal of the delay element to output an output signal D2, and a NAND gate NAND configured to perform a NAND operation on the output signals D1 and D2 of the first and second inverters INT1 and INT2 to output the enable signal CTRL.

Operation of the internal voltage generating circuit in the conventional semiconductor memory device will be described below.

FIG. 3 is a timing diagram of input/output signals of the enable signal generator 100 in FIG. 1.

Referring to FIG. 3, the enable signal generator 100 deactivates the output signal D1 of the first inverter INT1 in response to activation of the active command ACT (①).

The enable signal CTRL is activated in response to deactivation of the output signal D1 of the first inverter INT1 (②).

After a predetermined time from the deactivation timing of the output signal D1 of the first inverter INT1, the output signal D2 of the second inverter INT2 is deactivated (③).

Thereafter, the output signal D1 of the first inverter INT1 is activated in response to the deactivation of the active command ACT (④), but the output signal D2 of the second inverter INT maintains its deactivation state. Hence, the enable signal CTRL is still at the activation state.

The output signal D2 of the second inverter INT2 is activated after a predetermined time from the activation timing of the output signal D1 of the first inverter INT1 (⑤), and then the enable signal CTRL is deactivated in response to activation of the output signal D2 of the second inverter INT2 (⑥).

That is, the conventional enable signal generator 100 generates the enable signal CTRL having an activation period that is longer than the activation period of the active command ACT by the predetermined delay time.

In general, the activation timing of the active command ACT means a timing when data input/output (I/O) operation starts to be performed in the semiconductor memory device.

Although not shown, there is a precharge command (PCG) that is counter to the active command ACT. That is, the precharge command (PCG) is deactivated when the active command ACT is activated; however, the precharge command (PCG) is activated when the active command ACT is deactivated.

Therefore, the activation timing of the precharge command PCG is a timing when the data I/O operation is finished in the semiconductor memory device because the activation timing of the active command ACT is the input/output timings of the data.

In the conventional enable signal generator 100, however, although the enable signal CTRL is activated in response to the active command ACT, the enable signal CTRL is not deactivated directly in response to deactivation of the active command ACT but deactivated after a predetermined time from the deactivation timing of the active command ACT.

Here, the enable signal CTRL controls the generation of the internal voltage VINT by controlling the internal voltage generators 122A, 122B, 122C, 122D and 122E to be turned on/off.

Therefore, when the enable signal CTRL is activated, all the plurality of internal voltage generators 122A, 122B, 122C, 122D and 122E are enabled to increase a voltage level of the VINT terminal. On the contrary, when the enable signal CTRL is deactivated, all the plurality of internal voltage generators 122A, 122B, 122C, 122D and 122E are disabled to decrease a voltage level of the VINT terminal.

That is, it is no wonder that the semiconductor memory device normally performs the data I/O operation by generating the internal voltage VINT during the activation period of the active command ACT.

However, it is not proper that the internal voltage generating circuit still generates the internal voltage VINT even after the active command ACT is deactivated and the precharge command (PCG) is activated, that is, even after the data I/O operation has been finished in the semiconductor memory device.

Why the conventional internal voltage generating circuit generates the internal voltage VINT for a predetermined time even after the active command ACT is deactivated is because the internal voltage VINT is mainly used to input/output data, and further small amount of the internal voltage VINT is also necessarily used in order for the semiconductor memory device to return to an initial state before the data I/O operation was performed, in response to the precharge command (PCG) after the data I/O operation is finished.

For example, if the operation of increasing a voltage level of the VINT terminal is promptly terminated soon after the data I/O operation is finished in a state that the voltage level of the VINT terminal is lower than the predetermined level due to the data I/O operation, data may not be input/output normally during a next data I/O operation. Accordingly, the internal voltage VINT must be generated for a predetermined time in order that the semiconductor memory device may return to the initial state even after the data I/O operation is finished.

For this reason, the conventional semiconductor memory device has a configuration such that it does not generate the internal voltage VINT directly in response to the active command ACT but generates the internal voltage VINT using the enable signal CTRL. However, such a configuration leads to several problems below.

The internal voltage generating circuit of FIG. 1 includes the plurality of internal voltage generates 120A, 120B, 120C, 120D and 120E to drive the VINT terminal in parallel. Therefore, the internal voltage (VINT) generating circuit is designed to have a relatively small occupation area in the semiconductor memory device and to have a relatively high driving force.

If all the plurality of internal voltage generates 120A, 120B, 120C, 120D and 120E are enabled even in the case where the semiconductor memory device uses a great amount of the internal voltage VINT, the semiconductor memory device has a driving force enough to normally operate the semiconductor memory device. That is, when all the plurality of internal voltage generates 120A, 120B, 120C, 120D and 120E are enabled, the driving force becomes relatively very high. In this case, a great amount of current is also consumed.

However, in a period when the active command ACT is deactivated and the precharge command (PCG) is activated, the data I/O operation has been finished, and thus the amount of the internal voltage VINT to be used in this period is relatively small.

Nevertheless, the conventional semiconductor memory device generates the internal voltage VINT with the maximum driving force by enabling all the plurality of internal voltage generates 120A, 120B, 120C, 120D and 120E for a predetermined time. That is, the conventional semiconductor memory device generates the internal voltage VINT with a high driving force although it is unnecessary to use the high driving force.

Since the driving force is proportional to the current consumption, such a high driving force causes a great amount of current to be unnecessarily consumed. Of course, it is possible to somewhat reduce the current consumption by appropriately controlling a predetermined time required to generate the internal voltage VINT additionally, but a current still consumed unnecessarily even in this case.

SUMMARY OF THE INVENTION

Embodiments of the present invention are directed to providing a semiconductor memory device that can operate with low power by preventing a current consumed in generating an internal voltage (VINT) through driving a VINT terminal with stepwise-varying driving forces in an internal voltage generating circuit.

In accordance with an aspect of the present invention, there is provided an enable signal generator configured to generate first and second enable signals having activation timings determined in response to activation of an active command, the first enable signal being deactivated after a first time from a deactivation timing of the active command, and the second enable signal being deactivated after a second time longer than the first time from the deactivation timing of the active command and a plurality of internal voltage generators configured to generate internal voltages, one of the plurality of internal voltage generators being turned on/off in response to the first enable signal and another one of the internal voltage generators being turned on/off in response to the second enable signal.

In accordance with an aspect of the present invention, there is provided a method of operating a semiconductor memory device that includes a plurality of internal voltage generators configured to generate internal voltages by driving an internal voltage terminal with respective predetermined driving forces, the method includes a step of determining activation timings of first and second enable signals in response to activation of an active command, deactivating the first enable signal after a first time from a deactivation timing of the active command, and deactivating the second enable signal after a second time from the deactivation timing of the active command, the second time being greater than the first time and controlling a first subset of the internal voltage generators to be turned on/off in response to the first enable signal, and controlling a second subset of the internal voltage generators to be turned on/off in response to the second enable signal, wherein the first subset of the internal voltage generators differs from the second subset of the internal voltage generators.

DESCRIPTION OF SPECIFIC EMBODIMENTS

Hereinafter, a semiconductor memory device in accordance with the present invention will be described in detail with reference to the accompanying drawings.

Figure 1:
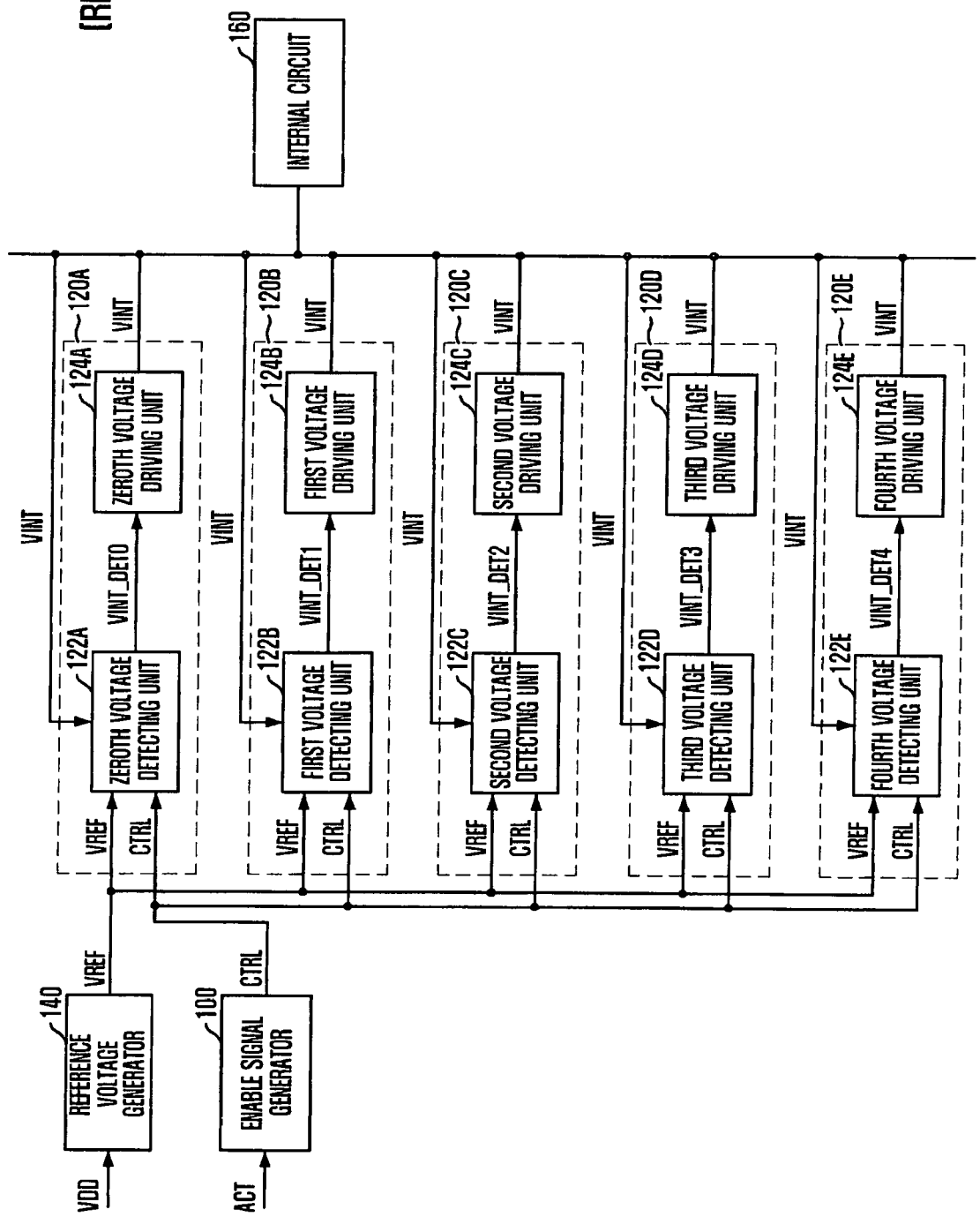
FIG. 1 is a block diagram of an internal voltage generating circuit in a conventional semiconductor memory device.
Figure 2:
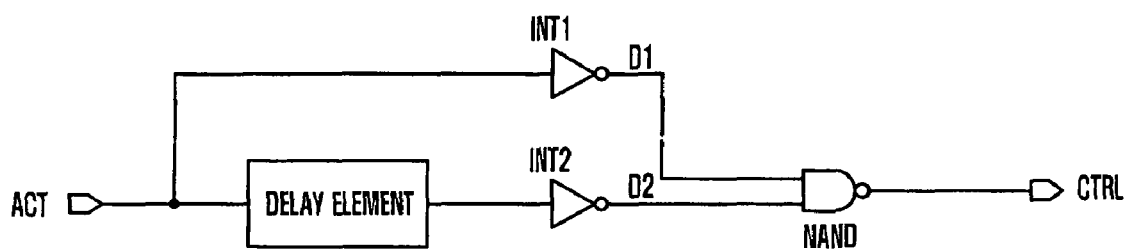
FIG. 2 is a circuit diagram of an enable signal generator of the internal voltage generating circuit in the conventional semiconductor memory device in FIG. 1.
Figure 3:
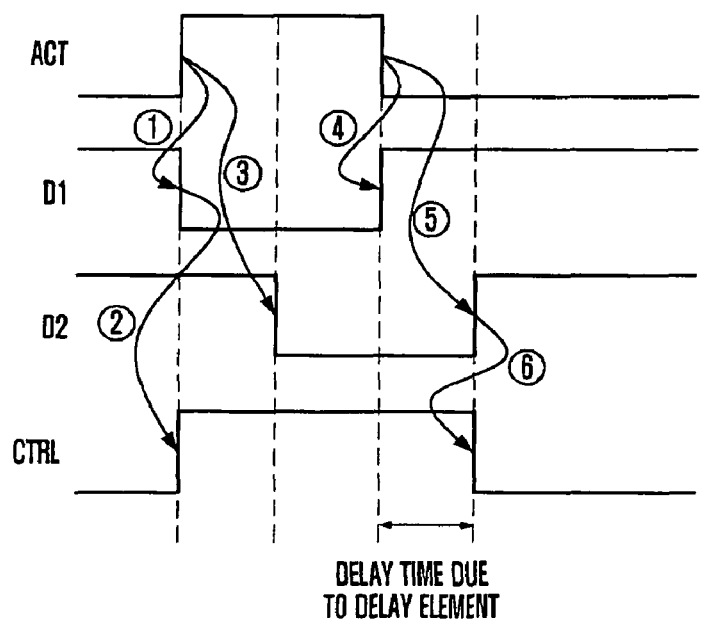
FIG. 3 is a timing diagram of input/output signals of the enable signal generator in FIG. 1.
Figure 4:
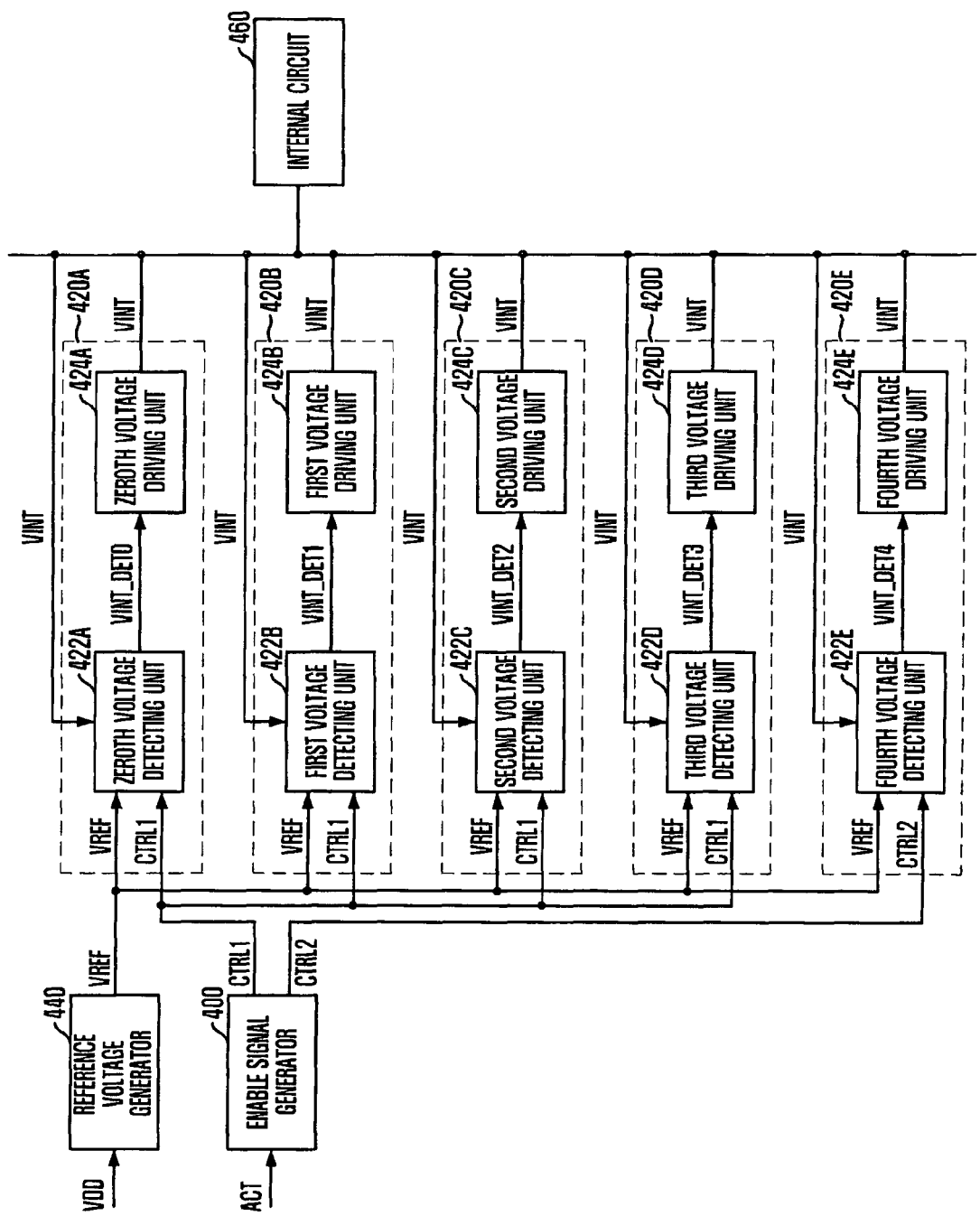
FIG. 4 is a block diagram of an internal voltage generating circuit in a semiconductor memory device in accordance with an embodiment of the present invention.

FIG. 4 is a block diagram of an internal voltage generating circuit in a semiconductor memory device in accordance with an embodiment of the present invention.

Referring to FIG. 4, the internal voltage generating circuit includes an enable signal generator 400, a reference voltage generator 440, and a plurality of internal voltage generators 420A, 420B, 420C, 420D and 420E. The enable signal generator 400 generates a first enable signal CTRL1 and a second enable signal CTRL2. Activation timings of the first and second enable signals CTRL1 and CTRL2 are determined in response to activation of an active command ACT corresponding to operation of the semiconductor memory device. The first enable signal CTRL1 is deactivated after a first time from the deactivation timing of the active command ACT, and the second enable signal CTRL2 is deactivated after a second time from the deactivation timing of the active command ACT. Herein, the second time is longer than the first time. The reference voltage generator 440 generates a reference voltage VREF having a constant voltage regardless of PVT (process, voltage, temperature) variations of the semiconductor memory device. The plurality of internal voltage generators, i.e., zeroth to fourth internal voltage generators 420A, 420B, 420C, 420D and 420E generate internal voltages VINT based on a predetermined target level corresponding to the reference voltage VREF, and are respectively turned on/off in response to one of the first and second enable signals CTRL1 and CTRL2.

The zeroth internal voltage generator 420A includes a zeroth internal voltage detecting unit 422A, and a zeroth voltage driving unit 424A. The zeroth internal voltage detecting unit 422A detects a voltage level of a VINT terminal based on the predetermined target level corresponding to the reference voltage VREF, and is turned on/off in response to the first enable signal CTRL1. The zeroth voltage driving unit 424A drives the VINT terminal to a voltage level corresponding to the predetermined target level in response to an output signal VINT_DET0 of the zeroth internal voltage detecting unit 422A. The first internal voltage generator 420B includes a first internal voltage detecting unit 422B, and a first voltage driving unit 424B. The first internal voltage detecting unit 422B detects a voltage level of the VINT terminal based on the predetermined target level corresponding to the reference voltage VREF, and is turned on/off in response to the first enable signal CTRL1. The first voltage driving unit 424B drives the VINT terminal to a voltage level corresponding to the predetermined target level in response to an output signal VINT_DET1 of the first internal voltage detecting unit 422B. The second internal voltage generator 420C includes a second internal voltage detecting unit 422C, and a second voltage driving unit 424C. The second internal voltage detecting unit 422C detects a voltage level of the VINT terminal based on the predetermined target level corresponding to the reference voltage VREF, and is turned on/off in response to the first enable signal CTRL1. The second voltage driving unit 424C drives the VINT terminal to a voltage level corresponding to the predetermined target level in response to an output signal VINT_DET2 of the second internal voltage detecting unit 422C. The third internal voltage generator 420D includes a third internal voltage detecting unit 422D, and a third voltage driving unit 424D. The third internal voltage detecting unit 422D detects a voltage level of the VINT terminal based on the predetermined target level corresponding to the reference voltage VREF, and is turned on/off in response to the first enable signal CTRL1. The third voltage driving unit 424D drives the VINT terminal to a voltage level corresponding to the predetermined target level in response to an output signal VINT_DET3 of the third internal voltage detecting unit 422D. The fourth internal voltage generator 420E includes a fourth internal voltage detecting unit 422E, and a fourth voltage driving unit 424E. The fourth internal voltage detecting unit 422E detects a voltage level of the VINT terminal based on the predetermined target level corresponding to the reference voltage VREF, and is turned on/off in response to the second enable signal CTRL2. The fourth voltage driving unit 424E drives the VINT terminal to a voltage level corresponding to the predetermined target level in response to an output signal VINT_DET4 of the fourth internal voltage detecting unit 422E.

The internal voltages VINT generated through the plurality of internal voltage generators 420A, 420B, 420C, 420D and 420E are input to an internal circuit 460 of the semiconductor memory device and then used to perform predetermined internal operations.

Figure 5:
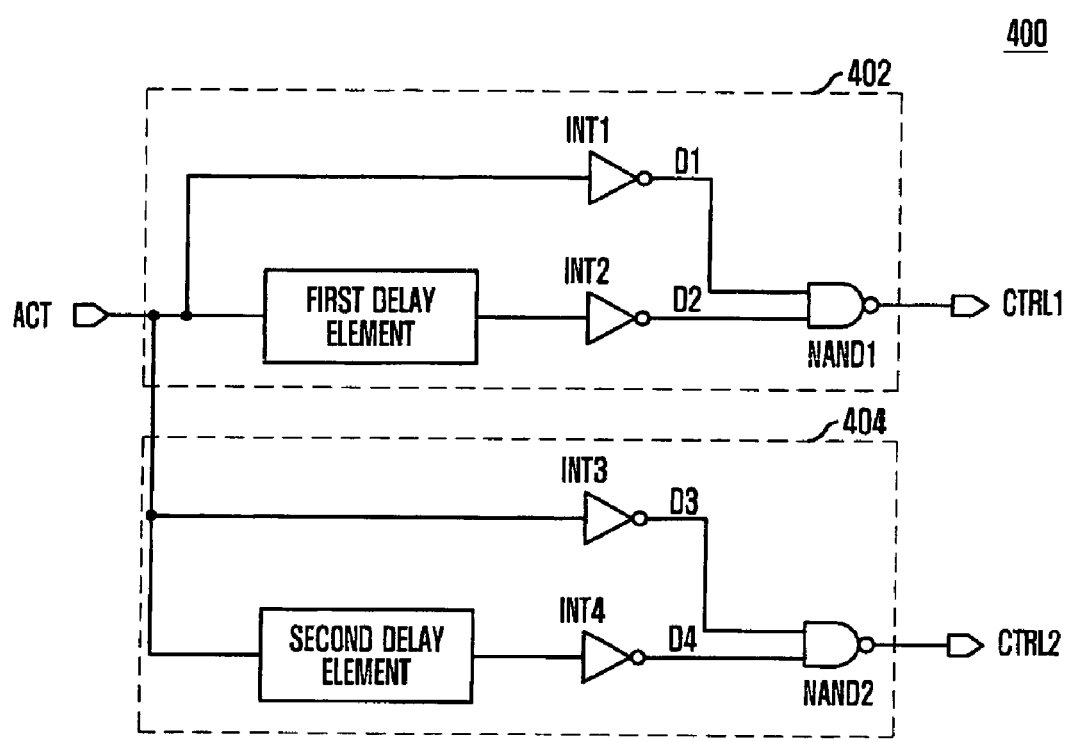
FIG. 5 is a circuit diagram of an enable signal generator of the internal voltage generating circuit in the semiconductor memory device in FIG. 4.

FIG. 5 is a circuit diagram of the enable signal generator 400 of the internal voltage generating circuit in the semiconductor memory device in FIG. 4.

Referring to FIG. 5, the enable signal generator 400 includes a first enable signal output unit 402 configured to output the first enable signal CTRL1 with a first pulse width in response to the active command ACT, and a second enable signal output unit 404 configured to output the second enable signal CTRL2 with a second pulse width greater than the first pulse width in response to the active command ACT.

The first enable signal output unit 402 includes a first inverter INT1 configured to receive the active command ACT to output an output signal D1, a first delay element configured to delay the active command ACT by a first time, a second inverter INT2 configured to receive an output signal of the first delay element to output an output signal D2, and a first NAND gate NAND1 configured to perform a NAND operation on the output signals D1 and D2 of the first and second inverters INT1 and INT2 to output the first enable signal CTRL1.

The second enable signal output unit 404 includes a third inverter INT3 configured to receive the active command ACT to output an output signal D3, a second delay element configured to delay the active command ACT by a second time, a fourth inverter INT4 configured to receive an output signal of the second delay element to output an output signal D4, and a second NAND gate NAND2 configured to perform a NAND operation on the output signals D3 and D4 of the third and fourth inverters INT3 and INT4 to output the second enable signal CTRL2.

Figure 6:
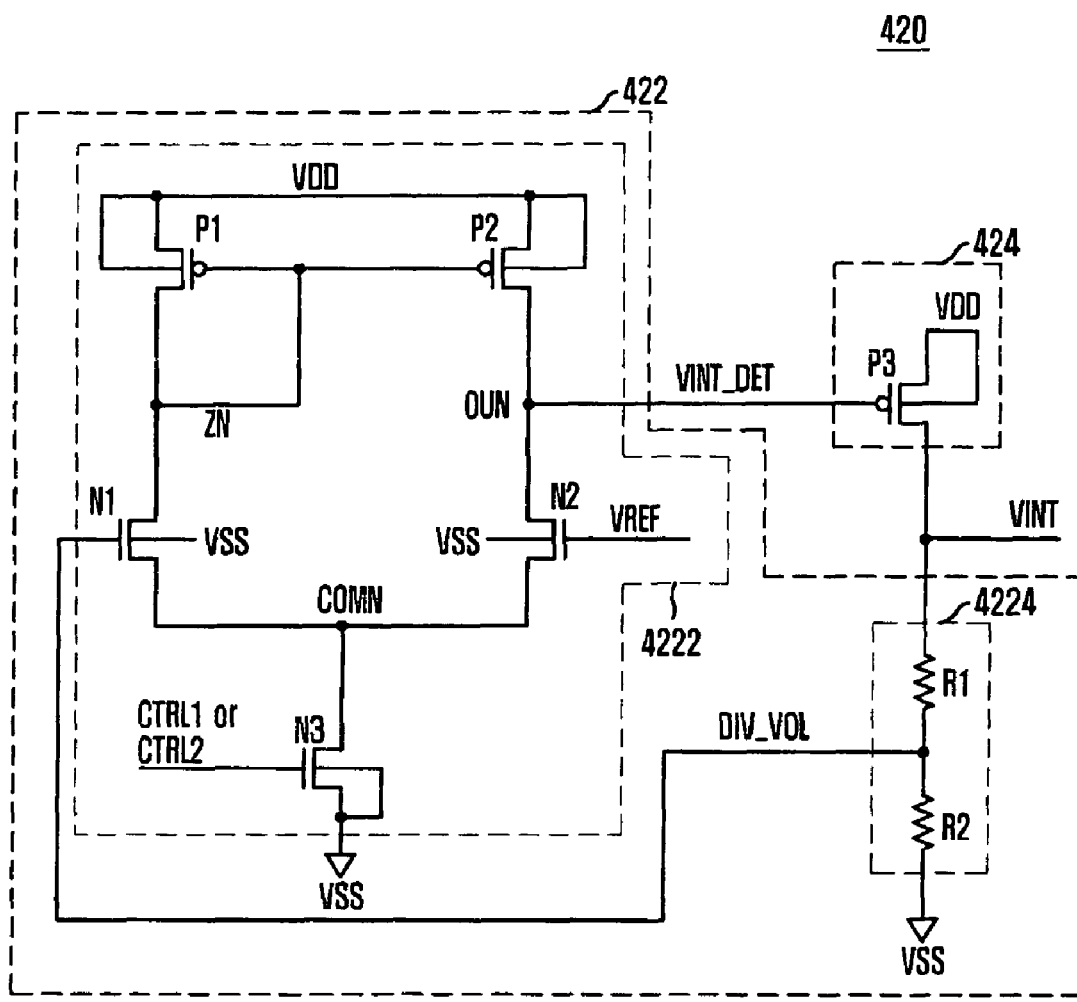
FIG. 6 is a circuit diagram of an internal voltage generator in FIG. 4.

FIG. 6 is a circuit diagram of the internal voltage generator 420 in FIG. 4.

The internal voltage generator 420 may be modified into different configurations depending on an internal voltage that is actually generated. For example, a circuit of generating a boosted voltage (VPP) using a charge-pumping method differs in a configuration from a circuit of generating a core voltage (VCORE) using a down-converting method. However, the boosted voltage (VPP) and the core voltage (VCORE) are generated in likewise manner, and thus only the core voltage (VCORE) using the down-converting method will be exemplarily illustrated herein because its circuit configuration is simpler. That is, the internal voltage generator 420 of FIG. 6 is similar in configuration to a core voltage generating circuit in typical semiconductor memory devices.

Referring to FIG. 6, the internal voltage generator 420 includes the voltage detecting unit 422, and the voltage driving unit 424. The voltage detecting unit 422 includes a voltage dividing unit 4224 and a voltage comparing unit 4222. The voltage dividing unit 4224 divides a voltage level of the VINT terminal by a predetermined ratio to generate a division voltage DIV_VOL. The voltage comparing unit 4222 compares the division voltage DIV_VOL with the reference voltage corresponding to the predetermined target level to generate comparison voltages VINT_DET0, VINT_DET1, VINT_DET2, VINT_DET3 and VINT_DET4 according to a comparison result. The voltage comparing unit 4222 is turned on/off in response to one of the first and second enable signals CTRL1 and CTRL2 input as bias voltages.

The voltage dividing unit 4224 of the voltage detecting unit 422 includes first and second resistors R1 and R2 connected in series between the VINT terminal and a ground voltage terminal (hereinafter, referred to as VSS terminal), and outputs the division voltage DIV_VOL at a connection node between the first and second resistors R1 and R2.

The voltage comparing unit 4222 of the voltage detecting unit 422 includes a first NMOS transistors N1, a second NMOS transistor N2, first and second PMOS transistors P1 and P2, and a third NMOS transistor N3. The first NMOS transistor N1 includes a gate receiving the division voltage DIV_VOL, a drain connected to a driving node ZN, and a source connected to a common node COMN. The first NMOS transistor N1 controls the amount of current flowing between the driving node ZN and the common node COMN in response to the division voltage DIV_VOL. The second NMOS transistor N2 includes a gate receiving the reference voltage VREF, a drain connected to an output node OUN, and a source connected to the common node COMN. The second NMOS transistor N2 controls the amount of current flowing between the output node OUN and the common node COMN in response to the reference voltage VREF. The first and second PMOS transistors P1 and P2 are connected in a current mirror form, and controls amounts of currents supplied to the driving node ZN and the output node OUN to be equal to each other. The third NMOS transistor N3 includes a gate receiving one of the first and second enable signals CTRL1 and CTRL2, a drain connected to the common node COMN, and a source connected to the VSS terminal.

The voltage driving unit 424 includes a PMOS transistor P3 configured to control the amount of current flowing between a power supply voltage terminal (hereinafter, referred to as VDD terminal) and the VINT terminal in response to the comparison voltage VINT_DET. The PMOS transistor P3 includes a gate receiving the comparison voltage VINT_DET, a source connected to the VDD terminal, and a drain connected to the VINT terminal.

Operation of the internal voltage generating circuit in accordance with the present invention will be described below.

Figure 7:
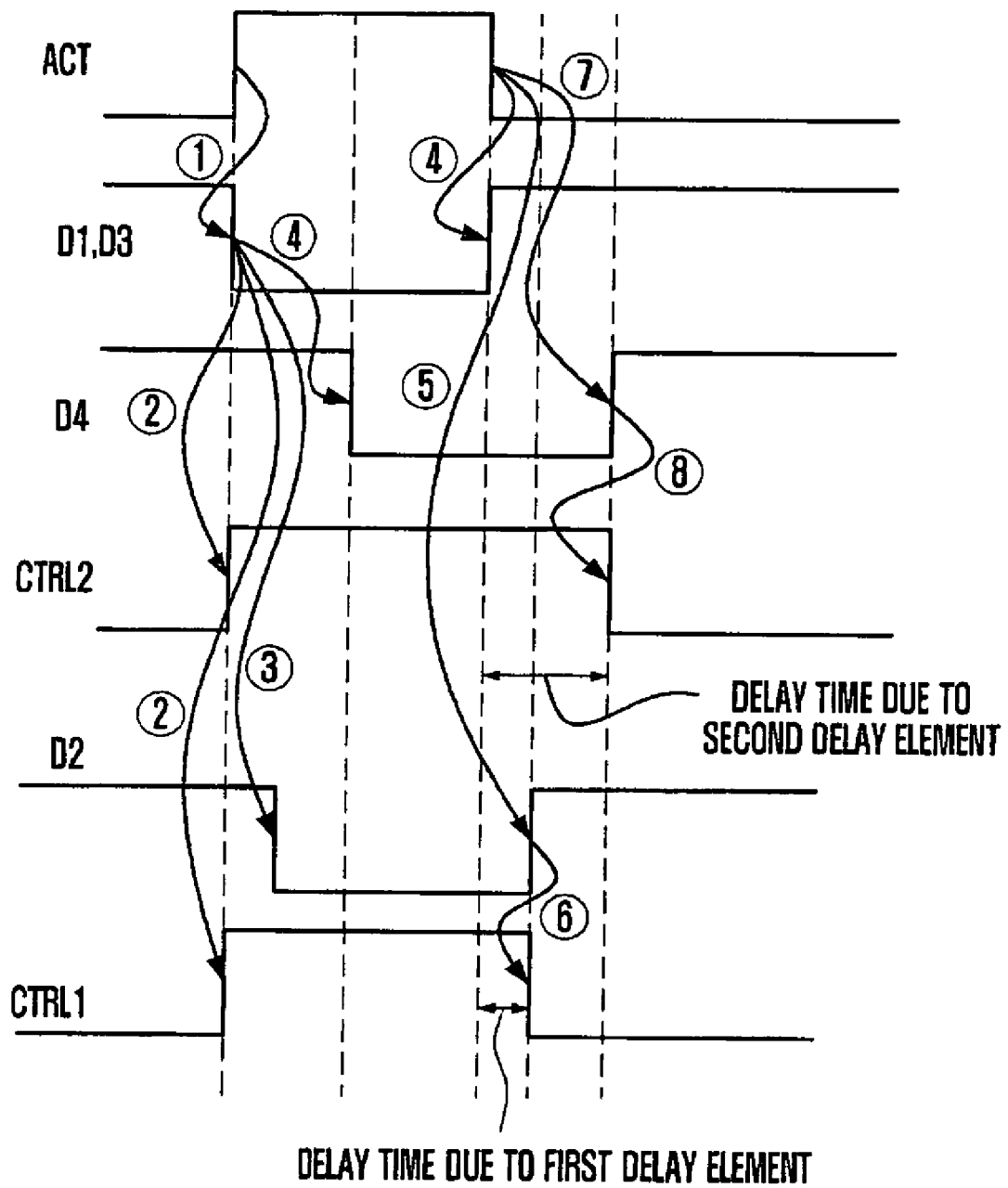
FIG. 7 is a timing diagram of input/output signals of the enable signal generator in FIG. 4.

FIG. 7 is a timing diagram of input/output signals of the enable signal generator 400 in FIG. 4.

Referring to FIG. 7, the enable signal generator 400 deactivates the output signal D1 of the first inverter INT1 and the output signal D3 of the third inverter INT3 in response to activation of the active command ACT (①).

The first enable signal CTRL1 is activated in response to deactivation of the output signal D1 of the first inverter INT1, and the second enable signal CTRL2 is activated in response to deactivation of the output signal D3 of the first inverter INT3 (②). Although it is illustrated in FIG. 7 that the first and second enable signals CTRL1 and CTRL2 are simultaneously activated at the activation timing of the active command ACT, they may be activated after a certain time from the activation timing of the active command ACT.

The output signal D2 of the second inverter INT2 is deactivated after the first time from the deactivation timing of the output signal D1 of the first inverter INT (③).

Likewise, the output signal D4 of the fourth inverter INT4 is deactivated after the second time from the deactivation timing of the output signal D3 of the third inverter INT3 (④).

From the timing diagram of FIG. 7, it can be appreciated that the deactivation timing of the output signal D2 of the second inverter INT2 is earlier than the deactivation timing of the output signal D4 of the fourth inverter INT4. That is, the first time is shorter than the second time.

Thereafter, the output signal D1 of the first inverter INT1 is activated in response to deactivation of the active command ACT (④), but the output signal D2 of the second inverter INT2 still maintains its deactivation state so that the first enable signal CTRL1 maintains its activation state.

The output signal D2 of the second inverter INT2 is activated after the first time from the activation timing of the output signal D1 of the first inverter INT1 (⑤), and the first enable signal CTRL1 is deactivated in response to activation of the output signal D2 of the second inverter INT2 (⑥).

Similarly, the output signal D3 of the third inverter INT3 is activated in response to deactivation of the active command ACT (④), but the output signal D4 of the fourth inverter INT4 still maintains its deactivation state so that the second enable signal CTRL2 maintains its activation state.

The output signal D3 of the third inverter INT3 is activated after the second time from the activation timing of the output signal D3 of the third inverter INT3 (⑦), and the second enable signal CTRL2 is deactivated in response to activation of the output signal D4 of the fourth inverter INT4 (⑧).

That is, the enable signal generator 400 in accordance with the embodiment of the present invention generates the first enable signal CTRL1 having an activation period that is longer than the activation period of the active command ACT by the first time, and also generates the second enable signal CTRL2 having an activation period that is longer than the activation period of the active command ACT by the second time. Herein, the second time is relatively longer than the first time.

The first enable signal CTRL1 controls the zeroth to third internal voltage generators 420A, 420B, 420C and 420D to be turned on/off, and the second enable signal CTRL2 controls the fourth internal voltage generator 420E to be turned on/off. Hence, the first and second enable signals CTRL1 and CTRL2 are used to control the generation of the internal voltage VINT.

Specifically, during the activation period of the active command ACT and the first time after the deactivation timing of the active command ACT, both the first and second enable signals CTRL1 and CTRL2 are activated to enable the plurality of internal voltage generators 420A, 420B, 420C, 420D and 420E. Therefore, all the plurality of internal voltage generators 420A, 420B, 420C, 420D and 420E drive the VINT terminal with the maximum driving force during this period.

However, during the second time after the lapse of the first time, only the fourth internal voltage generator 420E is enabled to drive the VINT terminal with a relatively small driving force.

After the lapse of the second time, all the plurality of internal voltage generators 420A, 420B, 420C, 420D and 420E are disabled so that the VINT terminal is not driven.

Consequently, the internal voltage generating circuit of the semiconductor memory device in accordance with the embodiment of the present invention generates the first and second enable signals CTRL1 and CTRL2 in response to the active command ACT, thus making it possible to drive the VINT terminal with stepwise-varying drive forces after the deactivation timing of the active command ACT.

In the conventional semiconductor memory device, a greater amount of current is undesirably consumed because the internal voltage generating circuit continuously drives the VINT terminal with the maximum driving force for a predetermined time required for generating the internal voltage VINT after the data input/output (I/O) operation is finished. In the semiconductor memory device of the present invention, however, the predetermined time, which is required for generating the internal voltage VINT after the data I/O operation is finished, is divided into several periods, and thus the internal voltage generating circuit drives the VINT terminal with a high driving force initially, and then drives it with a relatively low driving force. Therefore, it is possible to prevent unnecessary current consumption by driving the VINT terminal with stepwise-varying driving forces.

In accordance with the semiconductor memory device of the present invention, the internal voltage generating circuit can drive the internal voltage terminal with stepwise-varying driving forces after the deactivation of the active command ACT by controlling operation of the internal voltage generating circuit using the plurality of enable signals CTRL1 and CTRL2 generated in response to the active command ACT. This, therefore, makes it possible to prevent a current from being unnecessarily consumed after the data I/O operation is finished in the semiconductor memory device.

While the present invention has been described with respect to the specific embodiments, it will be apparent to those skilled in the art that various changes and modifications may be made without departing from the spirit and scope of the invention as defined in the following claims.

For instance, although the internal voltage generating circuit drives the internal voltage terminal using the two enable signals CTRL1 and CTRL2 in the previous embodiments, the present invention is not limited thereto. That is, the internal voltage generating circuit of the semiconductor memory device may drive the internal voltage terminal using a plurality of enable signals more than two.

Furthermore, logic gates and transistors exemplarily illustrated in the aforesaid embodiments may change their locations and kinds depending on polarities of signals.

What is claimed is:

1. A semiconductor memory device, comprising:
an enable signal generator configured to generate first and second enable signals having activation timings determined in response to activation of an active command, the first enable signal being deactivated after a first time from a deactivation timing of the active command, and the second enable signal being deactivated after a second time longer than the first time from the deactivation timing of the active command; and
a plurality of internal voltage generators configured to generate internal voltages, one of the plurality of internal voltage generators being turned on/off in response to the first enable signal and another one of the internal voltage generators being turned on/off in response to the second enable signal,
wherein the first and second enable signals are simultaneously activated.

2. The semiconductor memory device as recited in claim 1, wherein each of the internal voltage generators comprises:
a voltage detecting unit configured to detect an internal voltage terminal based on a predetermined target level, the voltage detecting unit being turned on/off in response to one of the first and second enable signals; and
a voltage driving unit configured to drive the internal voltage terminal to a voltage level corresponding to the predetermined target level in response to an output signal of the voltage detecting unit.

3. The semiconductor memory device as recited in claim 2, wherein the voltage detecting unit comprises:
a voltage dividing unit configured to divide a voltage level of the internal voltage terminal by a predetermined ratio to generate a division voltage; and
a voltage comparing unit configured to compare the division voltage with a reference voltage corresponding to the predetermined target level to generate a comparison voltage according to a comparison result, the voltage comparing unit being turned on/off in response to one of the first and second enable signals.

4. The semiconductor memory device as recited in claim 3, wherein the voltage dividing unit comprises first and second resistors connected in series between the internal voltage terminal and a ground voltage terminal, and outputs the division voltage at a connection node between the first and second resistors.

5. The semiconductor memory device as recited in claim 3, wherein the voltage comparing unit comprises:
   a first NMOS transistor configured to control an amount of current flowing between a driving node and a common node, the first NMOS transistor comprising a gate receiving the division voltage, a drain connected to the driving node, and a source connected to the common node;
   a second NMOS transistor configured to control an amount of current flowing between an output node and the common node, the second NMOS transistor comprising a gate receiving the reference voltage, a drain connected to the output node, and a source connected to the common node;
   first and second PMOS transistors connected in a current mirror configuration between the driving node and the output node to control amounts of currents applied to the driving node and the output node to be equal to each other; and
   a third NMOS transistor comprising a gate receiving one of the first and second enable signals, a drain connected to the common node, and a source connected to a ground voltage terminal.

6. The semiconductor memory device as recited in claim 3, wherein the voltage driving unit comprises a PMOS transistor configured to control an amount of current flowing a power supply voltage terminal and the internal voltage terminal, the PMOS transistor comprising a gate receiving the comparison voltage, a source connected to the power supply voltage terminal, and a drain connected to the internal voltage terminal.

7. The semiconductor memory device as recited in claim 1, wherein the enable signal generator activates the first and second enable signals simultaneously after a third time from an activation timing of the active command.

8. The semiconductor memory device as recited in claim 1, wherein the enable signal generator activates the first and second enable signals simultaneously at an activation timing of the active command.

9. The semiconductor memory device as recited in claim 1, wherein the enable signal generator comprises:
   a first enable signal output unit configured to output the first enable signal with a first pulse width in response to the active command; and
   a second enable signal output unit configured to output the second enable signal with a second pulse width in response to the active command, the second pulse width being greater than the first pulse width.

10. The semiconductor memory device as recited in claim 9, wherein the first enable signal output unit comprises:
    a first inverter configured to invert the active command;
    a first delay element configured to delay the active command by the first time;
    a second inverter configured to invert an output signal of the first delay element; and
    a first NAND gate configured to perform a NAND operation on an output signal of the first inverter and an output signal of the second inverter to output the first enable signal.

11. The semiconductor memory device as recited in claim 9, wherein the second enable signal output unit comprises:
    a third inverter configured to invert the active command;
    a second delay element configured to delay the active command by the second time;
    a fourth inverter configured to invert an output signal of the second delay element; and
    a second NAND gate configured to perform a NAND operation on an output signal of the third inverter and an output signal of the fourth inverter to output the second enable signal.

12. A method of operating a semiconductor memory device including a plurality of internal voltage generators each configured to generate a respective internal voltage by driving an internal voltage terminal with a respective predetermined driving force, the method comprising:
    determining activation timings of first and second enable signals in response to activation of an active command;
    deactivating the first enable signal after a first time from a deactivation timing of the active command, and deactivating the second enable signal after a second time from the deactivation timing of the active command, the second time being greater than the first time; and
    controlling a first subset of the internal voltage generators to be turned on/off in response to the first enable signal, and controlling a second subset of the internal voltage generators to be turned on/off in response to the second enable signal, wherein the first subset of the internal voltage generators differs from the second subset of the internal voltage generators,
    wherein the first and second enable signals are simultaneous activated.

13. The method as recited in claim 12, wherein the determining of the activation timings comprises activating the first and second enable signals simultaneously after a third time from an activation timing of the active command.

14. The method as recited in claim 12, wherein the determining of the activation timing comprises activating the first and second enable signals simultaneously at an activation timing of the active command.

15. The method as recited in claim 13, wherein the deactivating of the first and second enable signals comprises:
    outputting the first enable signal with a first pulse width in response to the active command; and
    outputting the second enable signal with a second pulse width in response to the active command, the second pulse width being greater than the first pulse width.

16. The method as recited in claim 12, wherein the controlling of the first and second subset of the internal voltage generators comprises:
    enabling all the plurality of internal voltage generators while the first and second enable signals are activated;
    disabling the first subset of the internal voltage generators, and enabling the second subset of the internal voltage generators while the first enable signal is deactivated and the second enable signal is activated; and
    disabling all the plurality of internal voltage generators while the first and second enable signals are deactivated.

* * * * *